United States Patent
Freidhof

(10) Patent No.: US 10,168,889 B2
(45) Date of Patent: Jan. 1, 2019

(54) MEASURING METHOD AND A MEASURING DEVICE WITH FINGERTIP ZOOM

(71) Applicant: Rohde & Schwarz GmbH & Co. KG, Munich (DE)

(72) Inventor: Markus Freidhof, Kirchseeon (DE)

(73) Assignee: Rohde & Schwarz GmbH & Co. KG, Munich (DE)

(*) Notice: Subject to any disclaimer, the term of this patent is extended or adjusted under 35 U.S.C. 154(b) by 0 days.

(21) Appl. No.: 14/631,340

(22) Filed: Feb. 25, 2015

(65) Prior Publication Data

US 2015/0242034 A1 Aug. 27, 2015

(30) Foreign Application Priority Data

Feb. 25, 2014 (DE) .................. 10 2014 203 355

(51) Int. Cl.
  *G06F 3/0488* (2013.01)
  *G01R 1/02* (2006.01)
  *G01R 13/02* (2006.01)

(52) U.S. Cl.
  CPC .......... *G06F 3/0488* (2013.01); *G01R 1/025* (2013.01); *G01R 13/029* (2013.01); *G01R 13/0218* (2013.01); *G06F 2203/04808* (2013.01)

(58) Field of Classification Search
  CPC ......... G06F 3/0488; G06F 2203/04808; G01R 1/025; G01R 13/0218; G01R 13/029
  See application file for complete search history.

(56) References Cited

U.S. PATENT DOCUMENTS

| | | | | |
|---|---|---|---|---|
| 4,755,811 A | * | 7/1988 | Slavin | G06F 3/033 324/121 R |
| 5,434,954 A | * | 7/1995 | Kawauchi | G01R 13/345 345/440 |
| 5,617,523 A | * | 4/1997 | Imazu | G01R 13/345 345/440 |
| 5,877,621 A | * | 3/1999 | Beyers | G01R 13/345 324/121 R |
| 5,939,877 A | * | 8/1999 | Alexander | G01R 13/029 324/121 R |
| 6,073,036 A | * | 6/2000 | Heikkinen | G06F 3/04842 379/354 |

(Continued)

OTHER PUBLICATIONS

Teledyne LeCroy, "Getting Started Manual—WaveSurfer MXs-B Oscilloscopes", company document, Jan. 2013, 126 pages.

*Primary Examiner* — Rodney Amadiz

(74) *Attorney, Agent, or Firm* — Lee & Hayes, PLLC

(57) ABSTRACT

A measuring device serves for the measurement and display of at least one measurement signal. It contains a measuring unit for the measurement of the at least one measurement signal and a display unit. In this context, the display unit comprises a processing unit and a touch-sensitive screen. The processing unit is embodied in order to display the at least one measured measurement signal by means of the touch-sensitive screen and to register and process touches on the touch-sensitive screen. The processing unit is further embodied in order, in the case of a touch of the touch-sensitive screen in a first position, to display the displayed at least one measured measurement signal in at least one first region around the first position magnified with a first magnification.

6 Claims, 4 Drawing Sheets

(56) References Cited

U.S. PATENT DOCUMENTS

| | | | | |
|---|---|---|---|---|
| 6,642,936 B1* | 11/2003 | Engholm | G06F 3/0481 | 345/661 |
| 6,774,890 B2* | 8/2004 | Engholm | G01R 13/20 | 345/173 |
| 7,227,549 B2* | 6/2007 | Beasley | G06F 3/0481 | 345/440.1 |
| 7,443,396 B2* | 10/2008 | Ilic | G01R 13/02 | 345/440 |
| 7,760,187 B2* | 7/2010 | Kennedy | G06F 3/0414 | 345/173 |
| 8,195,413 B2* | 6/2012 | Freidhof | G01R 13/029 | 324/76.11 |
| 8,893,051 B2* | 11/2014 | Crohas | G06F 3/04883 | 715/810 |
| 8,928,615 B2* | 1/2015 | Meng | | 178/18.01 |
| 9,063,630 B2* | 6/2015 | Williams | G06F 3/0481 | |
| 9,389,722 B2* | 7/2016 | Matsuki | G06F 3/041 | |
| 10,042,544 B2* | 8/2018 | Helfman | G06F 3/017 | |
| 2002/0126099 A1* | 9/2002 | Engholm | G01R 13/20 | 345/173 |
| 2003/0179219 A1* | 9/2003 | Nakano | G06F 3/0481 | 345/660 |
| 2006/0022955 A1* | 2/2006 | Kennedy | G06F 3/0414 | 345/173 |
| 2007/0035658 A1* | 2/2007 | Ketterer | G01R 1/025 | 348/375 |
| 2007/0132761 A1* | 6/2007 | Maruyama | G01R 23/16 | 345/440.1 |
| 2007/0226646 A1* | 9/2007 | Nagiyama | G06F 3/016 | 715/784 |
| 2008/0094367 A1* | 4/2008 | Van De Ven | G06F 3/0414 | 345/173 |
| 2009/0265126 A1* | 10/2009 | Freidhof | G01R 13/345 | 702/68 |
| 2009/0295830 A1* | 12/2009 | Muraveynyk | G06F 3/0481 | 345/629 |
| 2012/0146930 A1* | 6/2012 | Lee | G06F 3/04883 | 345/173 |
| 2013/0328787 A1* | 12/2013 | Stearns | G06F 3/038 | 345/173 |
| 2014/0026097 A1* | 1/2014 | Crohas | G06F 3/04883 | 715/810 |
| 2014/0125600 A1* | 5/2014 | Meng | G06F 3/0488 | 345/173 |
| 2014/0358877 A1* | 12/2014 | Hsiao | G06F 17/3028 | 707/695 |
| 2015/0242034 A1* | 8/2015 | Freidhof | G06F 3/0488 | 345/173 |
| 2015/0355834 A1* | 12/2015 | Huang | G06F 3/04883 | 715/773 |

* cited by examiner

MEASURING METHOD AND A MEASURING DEVICE WITH FINGERTIP ZOOM

FIELD OF THE INVENTION

The invention relates to a measuring method and a measuring device for the measurement and display of at least one measurement signal. In particular, the invention relates to a measuring method and a measuring device in which, by means of a touch-sensitive screen, a position of a screen touch is detected and a region around the screen touch is displayed magnified.

BACKGROUND OF THE INVENTION

In view of the increasing depths of storage in oscilloscopes and other measuring devices, increasing numbers of sampled values must be displayed on the screen of the measuring device. The use of a magnification function for this purpose is already known. With this function, an overview curve is displayed in a small size. In a further diagram, a magnified curve is shown. However, such an approach is sub-optimal with regard to the efficiency of use of the available screen area. On the one hand, the overview curve is displayed only in a very small size, so that a selection of a region to be magnified can be difficult in some cases. On the other hand, the display of the overview curve uses up a significant part of the screen which is not available for the display of the region currently relevant to the user. Furthermore, such a display is not very intuitive.

US patent application US 2013/0328787 A1 shows a measuring device with a touch-sensitive screen, in which various operating processes can be triggered through gestures with one or more fingers on the screen. In particular, the US patent application shows a magnification by means of a two-finger gesture in which an object is selected by touching with two fingers and magnified by moving the two fingers apart from one another. However, the method shown there is disadvantageous, since it requires a learning of operating gestures and does not therefore allow an intuitive operation.

The invention is based upon the object of providing a measuring method and a measuring device which allows a simple and intuitive operation, especially for the magnified display of measurement signals.

SUMMARY OF THE INVENTION

The measuring device according to one aspect of the invention serves for the measurement and display of at least one measurement signal. It contains a measuring unit for the measurement of the at least one measurement signal and a display unit. In this context, the display unit comprises a processing unit and a touch-sensitive screen. The processing unit is embodied in order to display the at least one measured measurement signal by means of the touch-sensitive screen, and to register and process touches on the touch-sensitive screen. The processing unit is further embodied in order, in the event of a touch on the touch-sensitive screen at a first position, to display the displayed at least one measured measurement signal in at least one first region around the first position magnified with a first magnification. Accordingly, simply by tapping a region relevant to the user, the user can obtain a magnification of the measurement signal in this region.

By preference, the processing unit is embodied in this context to display the displayed at least one measured measurement signal in the at least first region around the first position magnified only in a first dimension or only in a second dimension or in two dimensions. Accordingly, with the example of an oscilloscope, a magnification can be implemented only on the time axis or only on the amplitude axis or on both axes at the same time. With other measuring devices, a magnification of a frequency axis is also conceivable. This guarantees a particularly visually clear display.

By preference, the processing unit is further embodied to display the displayed at least one measured measurement signal in the at least first region around the first position with a greater brightness and/or color saturation and/or intensity and/or sharpness than outside the first region. In this manner, an additional emphasis of the magnified region is guaranteed, which further simplifies the operation of the measuring device.

By preference, the size of the first region is pre-set or can be selected by a user. In this manner, a great flexibility of operation can be achieved.

The processing unit is further preferably embodied to display the displayed at least one measured measurement signal without magnification after the end of the touch on the touch-sensitive screen. Accordingly, it is possible to return to the original display very intuitively.

In the case of a displacement of the touch to a second position, the processing unit is preferably further embodied to display the displayed at least one measured measurement signal magnified in at least one second region around the second position. In this manner, an alternative second region of the measurement signal can be displayed magnified without an effort-intensive return to the original display. This also simplifies operation.

The processing unit is preferably further embodied to display the displayed at least one measured measurement signal magnified in a third region around the first region and/or in a fourth region around the second region with a second magnification, wherein the second magnification is smaller than the first magnification. An infinite variation of the magnification with a maximum magnification directly at the first respectively second position and a reduction of the magnification the greater the distance from the touched position is also conceivable. In this manner, a seamless display can be achieved without interfering interruptions. A particularly intuitive operation is guaranteed in this manner.

By preference, the touch-sensitive screen is embodied in this context to detect a touch pressure. In this case, the processing unit is embodied to set the first magnification and/or the second magnification dependent upon the detected touch pressure. Accordingly, for example, a large magnification can be triggered with a strong touch pressure, and a small magnification can be triggered with a weak touch pressure. A particularly intuitive operation is guaranteed in this manner.

A method according to another aspect of the invention serves for the measurement and display of at least one measurement signal. In this context, the measurement signal is first measured. The measured measurement signal is displayed by means of a touch-sensitive screen. Touches on the touch-sensitive screen are registered and processed in this context. In the event of a touch on the touch-sensitive screen at a first position, the displayed at least one measured measurement signal is displayed magnified in at least one first region around the first position with a first magnification. Accordingly, with a very simple and intuitive operating process, a magnification of a relevant region of a measurement signal can be achieved.

BRIEF DESCRIPTION OF THE DRAWINGS

In the following, the invention is described by way of example on the basis of the drawings in which an advantageous exemplary embodiment of the invention is illustrated in a simplified manner. The drawings show.

DETAILED DESCRIPTION OF THE DRAWINGS

Figure 1:
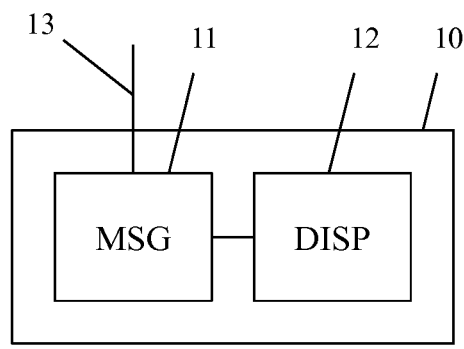
FIG. 1 an exemplary embodiment of the measuring device according to the invention.
Figure 2:
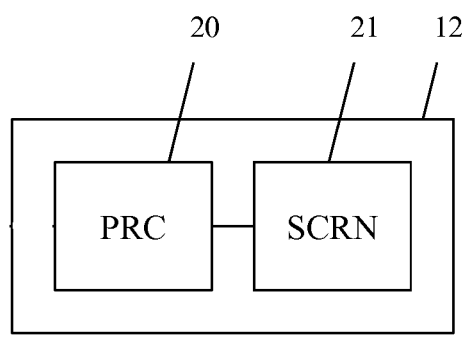
FIG. 2 a detailed view of the exemplary embodiment of the measuring device according to the invention.

With reference to FIGS. 1-2, the construction and functioning of an exemplary embodiment of the measuring device according to the invention will first be explained. Following this, with reference to FIGS. 3-4, possible displays of a screen of an exemplary embodiment of the measuring device according to the invention will be shown. Finally, the functioning of an exemplary embodiment of the measuring method according to the invention will be explained with reference to FIG. 5. The presentation and description of identical elements in similar drawings has not been repeated in some cases.

FIG. 1 shows an exemplary embodiment of the measuring device 10 according to the invention. The measuring device 10 according to the invention contains a measuring unit 11 and connected to the latter a display unit 12. The measuring unit 11 in this context is embodied to receive a measurement signal at a signal input 13. The measurement signal is measured, and the measured measurement signal is routed to the display unit 12. The display unit 12 displays the measurement signal on a screen. With regard to the embodiment of the display unit 12, reference is made to the deliberations relating to FIG. 2.

FIG. 2 shows the internal construction of the display unit 12 from FIG. 1. In this context, the display unit 12 contains a processing unit 20 which is connected to the measuring unit 11 from FIG. 1. Furthermore, it contains a screen 21 which is connected to the processing unit 20.

A measurement signal received by the measuring unit 11 from FIG. 1 is measured by the measuring unit 11. The measured measurement signal is supplied to the processing unit 20 of the display unit 12. In this context, the processing unit 20 optionally implements a pre-processing and displays the measured measurement signal by means of the screen 21. This screen 21 is a touch-sensitive screen. Touches on the touch-sensitive screen 21 are transmitted from the latter to the processing unit 20 which, on this basis, varies the display of the measurement signal.

If a touch on the touch-sensitive screen 21 is detected at a first position, the measurement signal is displayed magnified in a first region around the first position. As soon as the touch is no longer detected by the touch-sensitive screen 21, the display returns, controlled by the processing unit 20, to the original non-magnified display.

In this context, the magnification can take place only in a first dimension or only in a second dimension or in both dimensions. This will be explained in greater detail with reference to FIG. 3 and FIG. 4.

In addition to the magnification in the first region, for further emphasis, an increase in brightness and/or color saturation and/or intensity and/or sharpness in the first region is also conceivable. Alternatively or additionally, the brightness and/or color saturation and/or intensity and/or sharpness of the remainder of the display of the measurement signal can also be correspondingly reduced on the screen.

Furthermore, the touch-sensitive screen 12 can optionally detect a touch pressure. In this case, the touch-sensitive screen 21 routes the information about the touch pressure to the processing unit 20, which uses this information to adapt the display of the measurement signal. Accordingly, the processing unit 20 can adjust the magnification within the first region dependent upon the touch pressure. A small touch pressure can therefore be used for a small magnification and a large touch pressure can be used for a large magnification.

Figure 3:
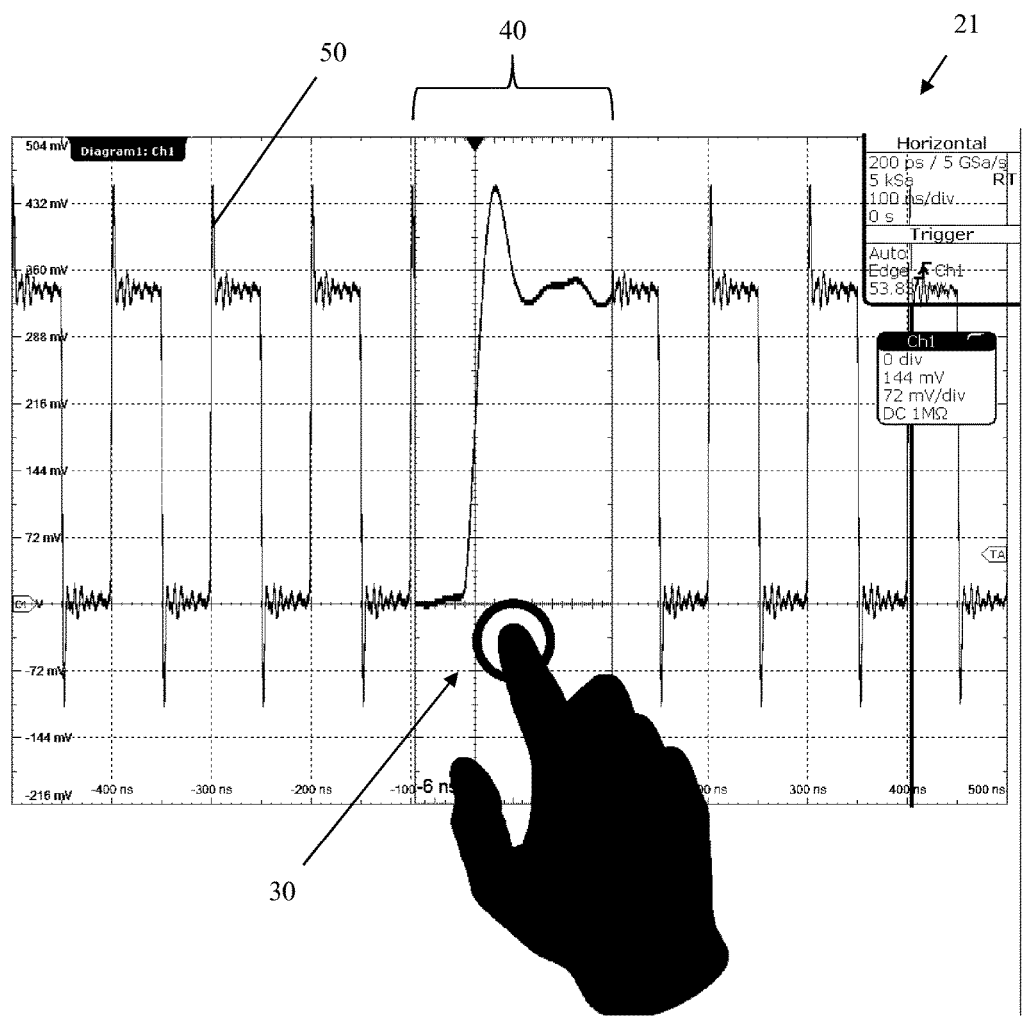
FIG. 3 a first view of a screen of the exemplary embodiment of the measuring device according to the invention.

FIG. 3 shows a first display of a screen 21 of the measuring device 10 from FIG. 1 and FIG. 2. In the display of FIG. 3, a measurement signal 50 is displayed in the time domain. Additionally, a touch by a user's hand is shown symbolically in a first position 30. The touch at the first position 30 leads to a magnified display of the measurement signal 50 in a first region 40 around the first position 30. The first region 40 here is displayed magnified only in a first dimension—along the time axis. This is clearly evident from the fact that the amplitude of the measurement signal 50 is also not increased in the region 40 displayed magnified by comparison with the remainder of the display of the measurement signal 50.

Alongside a pure magnification in this first dimension, only a magnification in the second dimension—here, the amplitude axis—is conceivable as an alternative.

Furthermore, a magnification in both dimensions is also possible.

Figure 4:
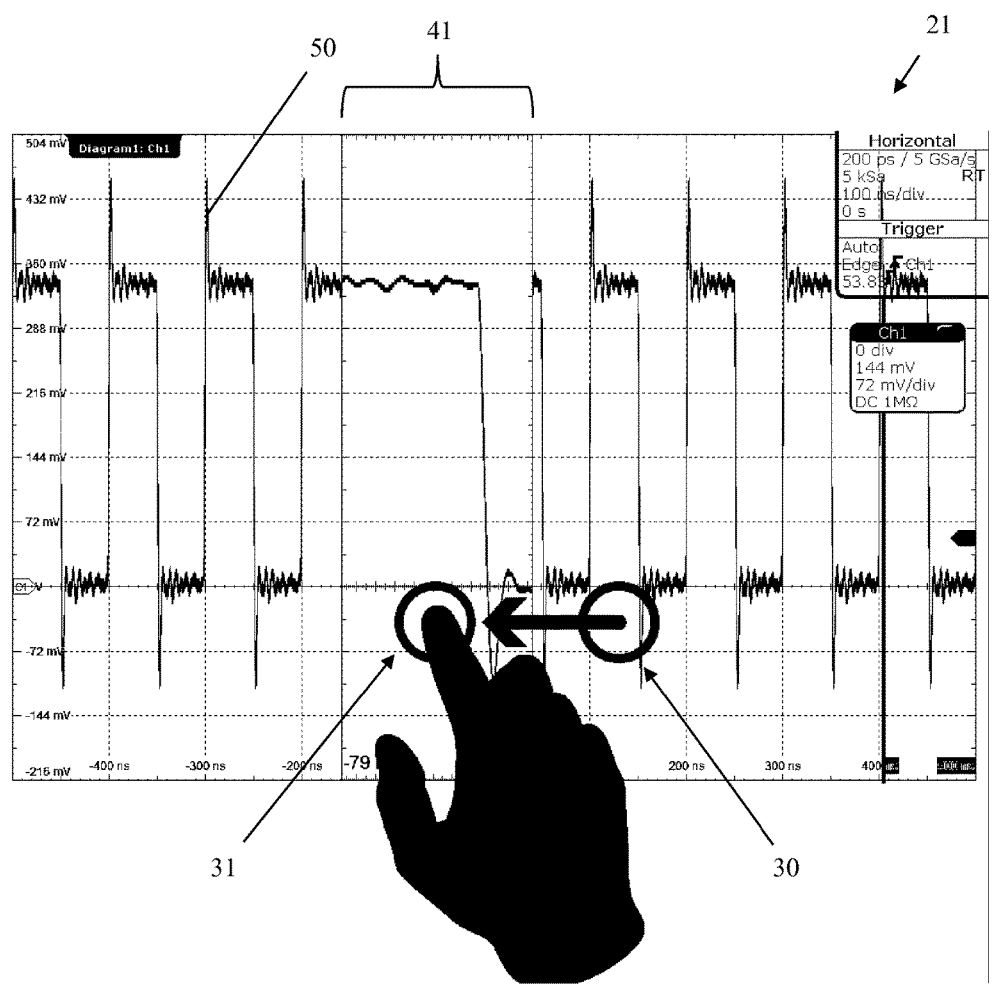
FIG. 4 a second view of the screen of the exemplary embodiment of the measuring device according to the invention.

FIG. 4 shows a second view of the screen 21 of the measuring device from FIG. 1 and FIG. 2. Here, a displacement of the touch from a first position 30 to a second position 31 is shown. After the displacement of the touch, a second region 41 is now displayed magnified. Here also, only a magnification of the measurement signal 50 in one dimension is shown—here, the time axis.

Optionally, after a displacement of the magnification, the brightness and/or color saturation and/or intensity and/or sharpness can also be increased in the now magnified region 41 or respectively reduced in the remaining region of the screen 21.

For the further improvement of operation, a multi-stage magnification can be implemented. In this case, the measurement signal is magnified with a first magnification in a first region around the first position and magnified with a second magnification in a second region which is disposed around the first region. In this context, the second magnification is less than the first magnification. Accordingly, a seamless transition is achieved between the non-magnified remaining regions and the magnified region. An infinite variation of the magnification towards the touch position is also conceivable. In this context, the magnification is greatest directly at the first position 30 or the second position 31 and is reduced with increasing distance.

Figure 5:
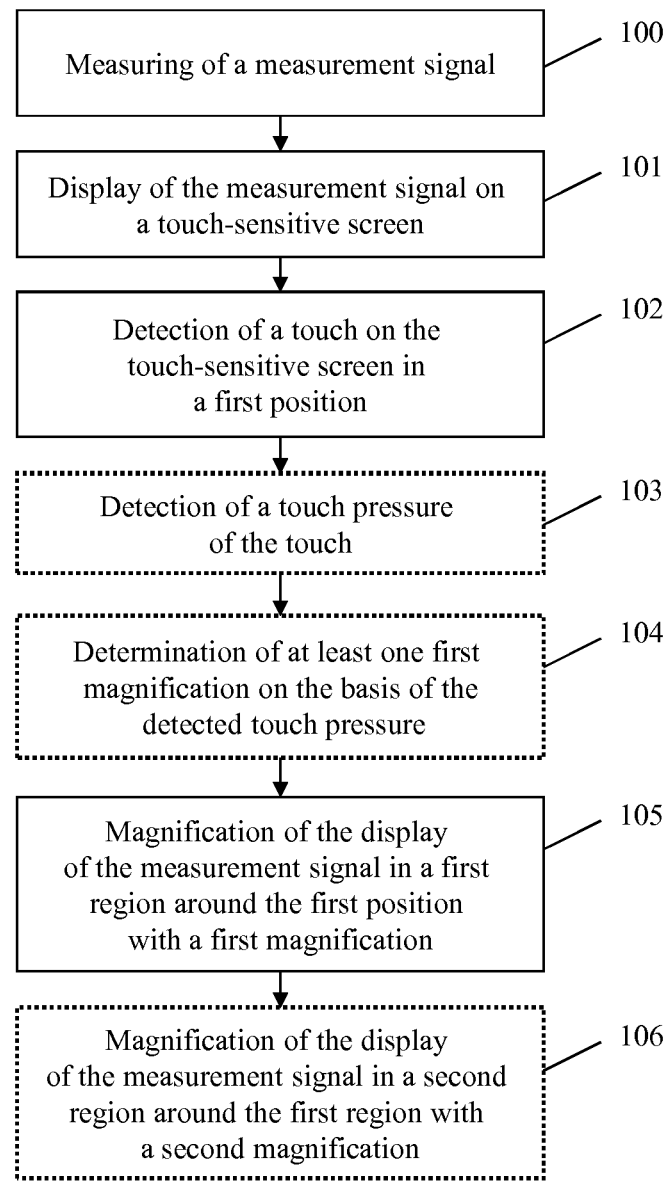
FIG. 5 an exemplary embodiment of the measuring method according to the invention.

Finally, FIG. 5 shows an exemplary embodiment of the measuring method according to the invention. In a first step 100, the measurement of the measurement signal is implemented. In a second step 101, the measurement signal is displayed on a touch-sensitive screen. In a third step 102, a detection of a touch on the touch-sensitive screen in at least one first position takes place.

In an optional fourth step 103, a detection of the touch pressure of the touch is implemented. In a further optional fifth step 104, at least one first magnification to is determined on the basis of the detected touch pressure. In this manner, in the event of a large detected touch pressure, a strong magnification is selected and, in the event of a relatively smaller detected touch pressure, a smaller magnification is selected.

In a sixth step 105, a magnified display of the measurement signal in a first region around the first position is implemented with the first magnification specified in the optional fifth step 104. If the optional step 104 has not been implemented, the magnified display takes place with a predetermined magnification or a first magnification adjustable by a user.

In an optional seventh step 106, a magnified display of the measurement signal in a second region around the first region is implemented with a second magnification. This second magnification is also predetermined or adjustable by a user, or can optionally also be adjusted in the optional fifth step 104, also on the basis of the touch pressure. In this context, the second magnification is less than the first magnification.

The invention is not restricted to the illustrated exemplary embodiment. In particular, measurement signals of arbitrary measuring devices can be processed in this manner and displayed. A magnification of different axes is also conceivable. Accordingly, a frequency axis and/or a power axis can also be magnified. A display of several measurement signals at the same time and the corresponding magnification is also conceivable. Advantageously, within the scope of the invention, all of the features described above or features shown in the drawings can be combined arbitrarily with one another.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed:

1. A measuring method for the measurement and display of at least one measurement signal, the measuring method comprising:
    the measurement signal is measured;
    by means of a touch-sensitive screen, the at least one measured measurement signal is displayed and touches on the touch-sensitive screen are registered and processed;
    in the case of a touch on the touch-sensitive screen at a first position, the displayed at least one measured measurement signal is displayed magnified in at least one first region with a first magnification, wherein the first region is configured to be around the first position, wherein in the first region, the displayed at least one measured measurement signal is displayed with a greater sharpness than outside the first region, wherein after an end of the touch on the touch-sensitive screen, the displayed at least one measured measurement signal is displayed without magnification, and wherein in the case of a displacement of the touch to a second position, the displayed at least one measured measurement signal is displayed magnified in at least one second region, the second region configured to be around the second position;
    wherein the displayed at least one measured measurement signal is displayed in at least one of a third region or a fourth region and magnified with a second magnification, the third region configured to be around the first region and the fourth region configured to be around the second region and wherein the second magnification is smaller than the first magnification; and
    wherein the displayed at least one measuring signal is displayed in the first region with the first magnification and in the third region with a third magnification simultaneously, and wherein the displayed at least one measurement signal is displayed in the second region with the second magnification and the fourth region with a fourth magnification simultaneously.

2. The measuring method according to claim 1, wherein in the first region, the displayed at least one measured measurement signal is displayed magnified based on one of only in a first dimension, only in a second dimension or in two dimensions.

3. The measuring method according to claim 1, wherein the displayed at least one measured measurement signal is further displayed with a greater at least one of the brightness, the color saturation, or the intensity than outside the first region.

4. The measuring method according to claim 1, wherein a size of the first region is pre-set or selected by a user.

5. The measuring method according to claim 1, further comprising:
    a touch pressure is detected by the touch-sensitive screen; and
    the first magnification is set based at least on the detected touch pressure.

6. A measuring device for the measurement and display of at least one measurement signal, comprising:
    the display of at least one measurement signal is done by a display unit that comprises a processing unit and a touch-sensitive screen;
    the processing unit is embodied in order, by means of the touch-sensitive screen, to display the at least one measured measurement signal and to register and process touches on the touch-sensitive screen;
    the processing unit is embodied in order, in the case of a touch on the touch-sensitive screen at a first position, to display the displayed at least one measured measurement signal in at least one first region around the first position magnified with a first magnification, wherein the first region is configured to be around the first position, wherein in the first region, the displayed at least one measured measurement signal is displayed with a greater sharpness than outside the first region, wherein after an end of the touch on the touch-sensitive screen, the displayed at least one measured measurement signal is displayed without magnification, and wherein in the case of a displacement of the touch to a second position, the displayed at least one measured measurement signal is displayed magnified in at least one second region, the second region configured to be around the second position;

wherein the displayed at least one measured measurement signal is displayed in at least one of a third region or a fourth region and magnified with a second magnification, the third region configured to be around the first region and the fourth region configured to be around the second region and wherein the second magnification is smaller than the first magnification; and wherein the displayed at least one measuring signal is displayed in the first region with the first magnification and in the third region with a third magnification simultaneously, and wherein the displayed at least one measurement signal is displayed in the second region with the second magnification and the fourth region with a fourth magnification simultaneously.

* * * * *